(12) United States Patent
Chen et al.

(10) Patent No.: US 11,280,887 B2
(45) Date of Patent: Mar. 22, 2022

(54) LIDAR SYSTEM AND ELECTRONIC DEVICE

(71) Applicant: TAIWAN GREEN POINT ENTERPRISES CO., LTD., Taichung (TW)

(72) Inventors: Chun-Wei Chen, Taichung (TW); Ching-Lung Mao, Taichung (TW); Chin-Feng Yang, Taichung (TW)

(73) Assignee: Taiwan Green Point Enterprises Co., Ltd., Taichung (TW)

(*) Notice: Subject to any disclaimer, the term of this patent is extended or adjusted under 35 U.S.C. 154(b) by 758 days.

(21) Appl. No.: 16/120,970

(22) Filed: Sep. 4, 2018

(65) Prior Publication Data

US 2019/0285733 A1    Sep. 19, 2019

(30) Foreign Application Priority Data

Mar. 14, 2018  (TW) .................. 107108707

(51) Int. Cl.
| | |
|---|---|
| *H02S 40/38* | (2014.01) |
| *G01S 7/481* | (2006.01) |
| *H02S 99/00* | (2014.01) |
| *H01L 25/13* | (2006.01) |
| *H02S 20/30* | (2014.01) |

(52) U.S. Cl.
CPC ............ *G01S 7/4817* (2013.01); *H01L 25/13* (2013.01); *H02S 20/30* (2014.12); *H02S 40/38* (2014.12); *H02S 99/00* (2013.01)

(58) Field of Classification Search
CPC ........ G01S 7/4817; H02S 99/00; H02S 20/30; H02S 40/38; H01L 25/13; Y02E 70/30; Y02E 10/50
See application file for complete search history.

(56) References Cited

U.S. PATENT DOCUMENTS

| | | | |
|---|---|---|---|
| 8,658,882 B1* | 2/2014 | Ballou | H02S 10/40 |
| | | | 136/244 |
| 10,109,183 B1* | 10/2018 | Franz | H04B 5/0081 |
| 2018/0191404 A1* | 7/2018 | Berger | H04B 10/116 |
| 2020/0192084 A1* | 6/2020 | Bretagnol | B60S 1/0848 |

* cited by examiner

*Primary Examiner* — Thomas C Lee
*Assistant Examiner* — Charles Cai
(74) *Attorney, Agent, or Firm* — Young Basile Hanlon & MacFarlane, P.C.

(57) ABSTRACT

An electronic device includes a base seat, a rotary seat rotatably coupled to the base seat, a drive mechanism for driving the rotary seat to rotate relative to the base seat, a power consumption unit disposed on and co-rotatable with the rotary seat, and a power supply unit. The power supply unit includes a solar panel disposed in the rotary seat and electrically connected to the power consumption unit, and a light emitting module operable to emit light toward the solar panel so that the solar panel transforms light energy into electric energy, which is supplied to the power consumption unit.

20 Claims, 10 Drawing Sheets

US 11,280,887 B2

LIDAR SYSTEM AND ELECTRONIC DEVICE

CROSS-REFERENCE TO RELATED APPLICATION

This application claims priority of Taiwanese Patent Application No. 107108707, filed on Mar. 14, 2018.

FIELD

The disclosure relates to an electronic device, and more particularly to an electronic device and a LiDAR system that include a power supply unit for driving rotational movement.

BACKGROUND

An electronic device, for example, a LiDAR (light detection and ranging) system, generally includes a rotary member and a power supply unit for driving rotation of the rotary member. A conventional LiDAR system includes a stationary seat, a rotary seat rotatably disposed on the stationary seat, a drive mechanism disposed on the stationary seat and connected to the rotary seat for driving rotation of the rotary seat, and an optical distance measuring unit disposed on the rotary seat. During operation, the rotary seat is driven to rotate by a motor of the drive mechanism, and the optical distance measuring unit co-rotates with the rotary seat, and transmits a light beam and receives the light beam when reflected by an object for distance measurement. The optical distance measuring unit requires a continuous power supply for proper operation. In order to ensure long-hour operation without adversely affecting the rotation of the rotary seat, the conventional LiDAR system provides the power supply by electromagnetic induction, which is generated when the rotary seat rotates. The rotary seat has to rotate at a relatively high speed in order to generate sufficient power supply. However, precision of the distance measurement are decreased when the rotary seat rotates too fast. Therefore, in order to ensure precision of the distance measurement, the rotary seat cannot be rotated too fast, so that the power generated therefrom may not be sufficient to provide proper operation of the optical distance measuring unit, especially for long term use.

SUMMARY

Therefore, an object of the disclosure is to provide a LiDAR system that can alleviate the drawback of the prior art.

Another object of the disclosure is to provide an electronic device that can alleviate the drawback of the prior art.

According to one aspect of the disclosure, the LiDAR system includes a base seat, a rotary seat, a drive mechanism, an optical distance measuring unit, and a power supply unit. The base seat includes a mounting base, and a seat-supporting structure that extends upwardly from the mounting base. The rotary seat is rotatably coupled to the seat-supporting structure. The drive mechanism is disposed in the base seat and is for driving the rotary seat to rotate on the seat-supporting structure. The optical distance measuring unit is disposed co-rotatably on the rotary seat, and includes at least one optical detection module that is operable to emit light and receive the light when reflected. The power supply unit includes a solar panel that is disposed on the seat-supporting structure and that is electrically connected to the optical distance measuring unit, and a light emitting module that is operable to emit light toward the solar panel so that the solar panel transforms light energy into electric energy, which is supplied to the optical distance measuring unit.

According to another aspect of the disclosure, the LiDAR system includes a base seat, a rotary seat, a drive mechanism, at least one optical detection module, and a power supply unit. The rotary seat is rotatably coupled to the base seat. The drive mechanism is disposed in the base seat and is for driving the rotary seat to rotate relative to the base seat. The at least one optical detection module is disposed on and co-rotatable with the rotary seat, and is operable to emit light and receive the light when reflected. The power supply unit includes a solar panel that is disposed in the rotary seat and that is electrically connected to the at least one optical detection module, and a light emitting module that is disposed in the base seat, and that is operable to emit light toward the solar panel so that the solar panel transforms light energy into electric energy, which is supplied to the at least one optical detection module.

According to another aspect of the disclosure, the electronic device includes a base seat, a rotary seat, a drive mechanism, a power consumption unit, and a power supply unit. The base seat includes a mounting base. The rotary seat is rotatably coupled to the base seat. The drive mechanism is disposed on the base seat and is for driving the rotary seat to rotate relative to the base seat. The power consumption unit is disposed in and co-rotatable with the rotary seat. The power supply unit includes a solar panel that is disposed in the rotary seat and that is electrically connected to the power consumption unit, and a light emitting module that is disposed on the mounting base, and that is operable to emit light toward the solar panel so that the solar panel transforms light energy into electric energy, which is supplied to the power consumption unit.

According to another aspect of the disclosure, the electronic device includes a base seat, a rotary seat, a drive mechanism, a power consumption unit, and a power supply unit. The base seat includes a mounting base. The rotary seat is rotatably coupled to the base seat. The drive mechanism is disposed in the base seat and is for driving the rotary seat to rotate on the base seat. The power consumption unit is disposed in and co-rotatable with the rotary seat. The power supply unit includes a solar panel that is disposed in the rotary seat and that is electrically connected to the power consumption unit, and a light emitting module that includes a plurality of spaced-apart light emitting diodes disposed on the mounting base and operable to emit light toward the solar panel so that the solar panel transforms light energy generated by the light emitting diodes into electric energy, which is supplied to the power consumption unit.

According to another aspect of the disclosure, the electronic device includes a base seat, a rotary seat, a drive mechanism, a power consumption unit, and a power supply unit. The drive mechanism is disposed for driving the rotary seat to rotate on the base seat. The power consumption unit is disposed on and co-rotatable with the rotary seat. The power supply unit includes a solar panel that is disposed in the rotary seat and that is electrically connected to the power consumption unit, and a light emitting module that includes a plurality of light emitting diodes disposed on the base seat and operable to emit light toward the solar panel so that the solar panel transforms light energy generated by the light emitting diodes into electric energy, which is supplied to the power consumption unit.

According to another aspect of the disclosure, the electronic device includes a base seat, a rotary seat, a drive mechanism, a power consumption unit, and a power supply unit. The drive mechanism is disposed for driving the rotary seat to rotate on the base seat. The power consumption unit is disposed on and co-rotatable with the rotary seat. The power supply unit includes a solar panel that is disposed in the rotary seat and that is electrically connected to the power consumption unit, and a light emitting module that includes a plurality of light emitting diodes disposed on the base seat, equidistant from the solar panel, and operable to emit light toward the solar panel so that the solar panel transforms light energy generated by the light emitting diodes into electric energy, which is supplied to the power consumption unit.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
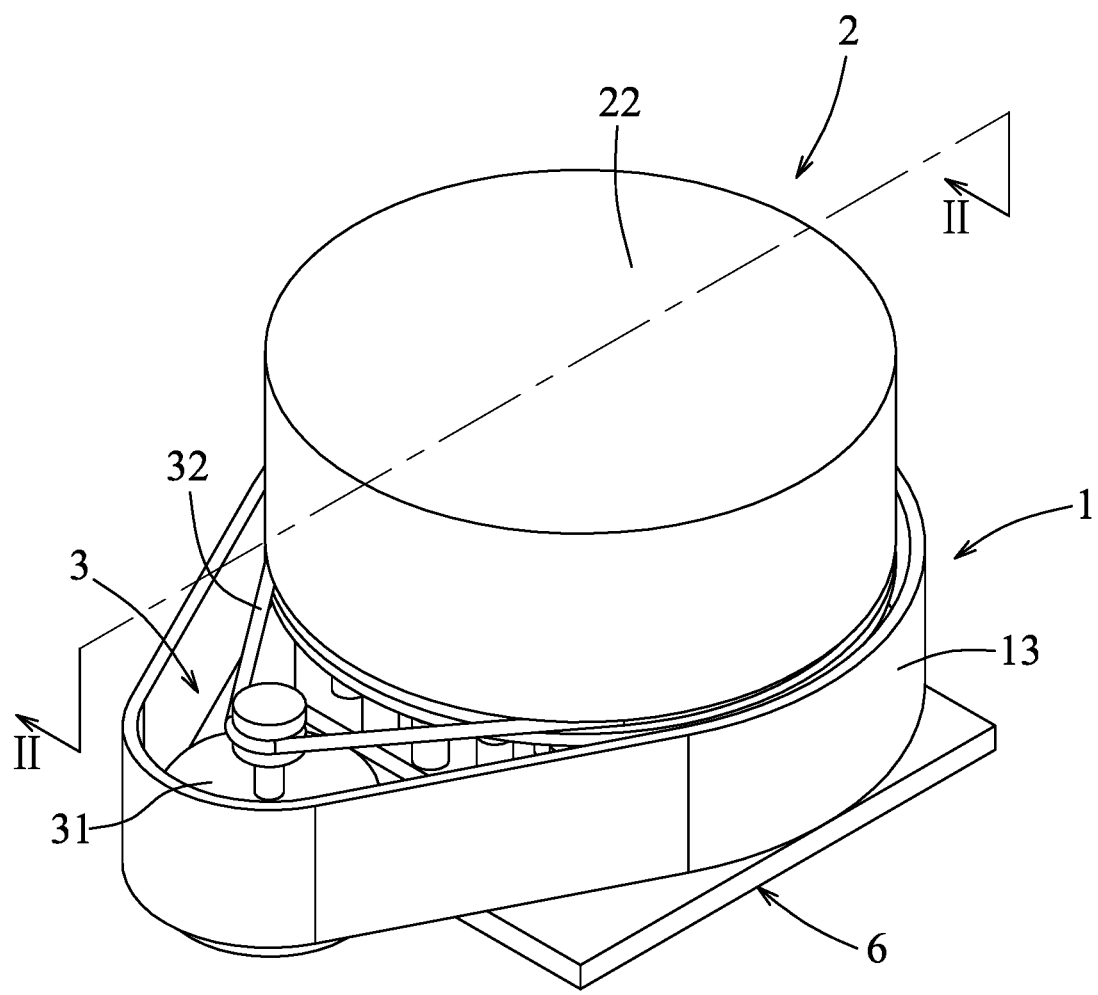
FIG. 1 is a perspective view illustrating a first embodiment of an electronic device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
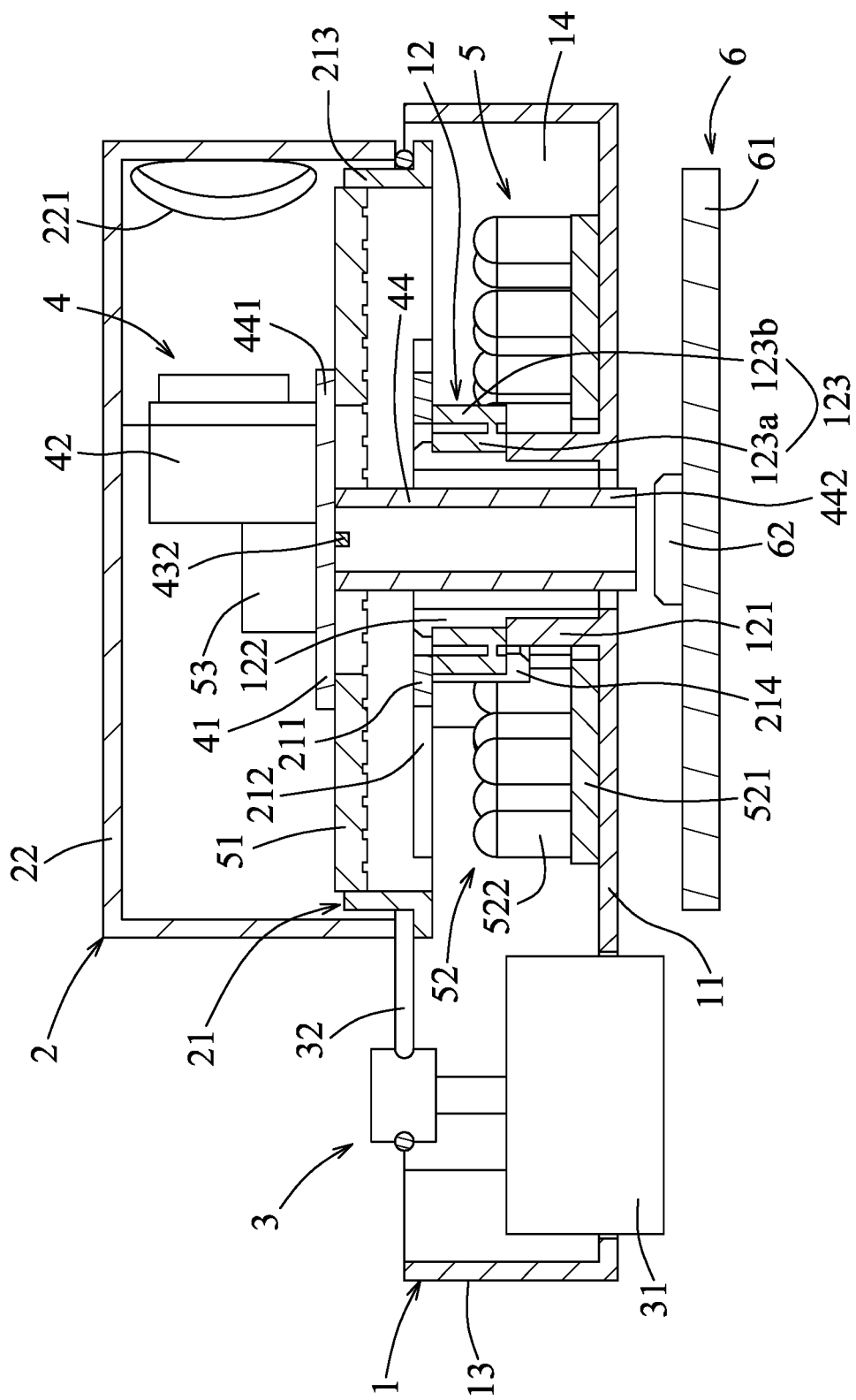
FIG. 2 is a sectional view taken along line II-II of FIG. 1, illustrating the first embodiment.
Figure 3:
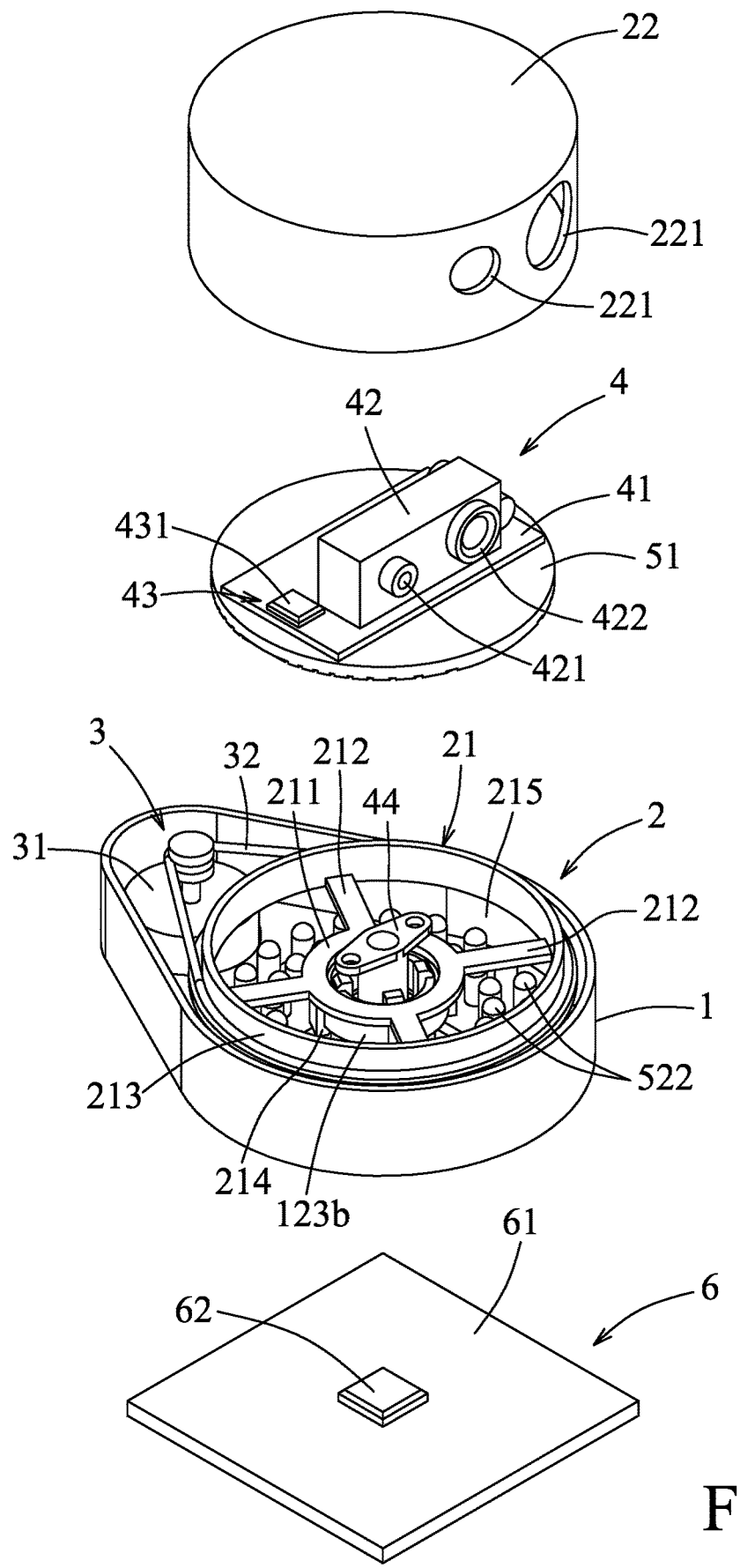
FIG. 3 is a partly exploded top perspective view of the first embodiment.
Figure 4:
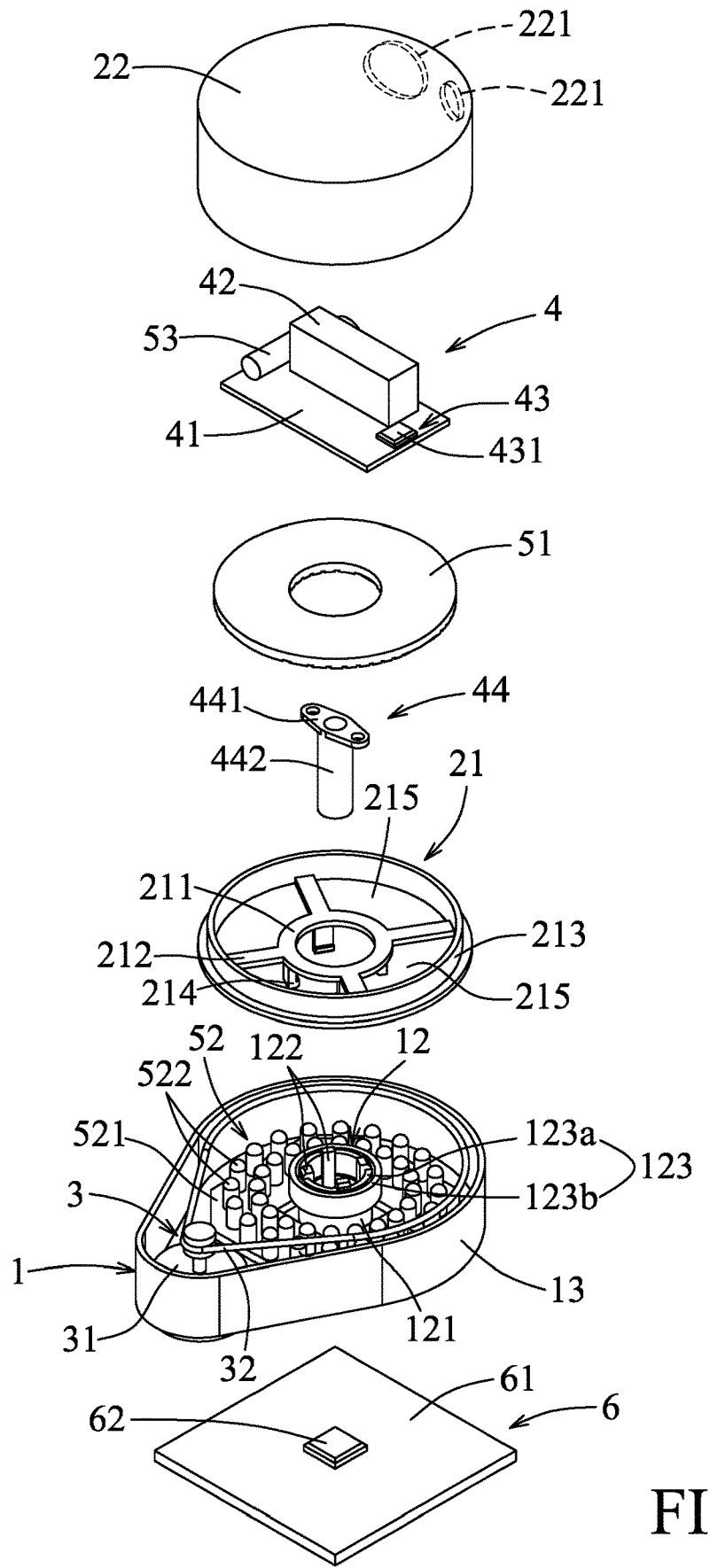
FIG. 4 is another partly exploded top perspective view of the first embodiment.
Figure 5:
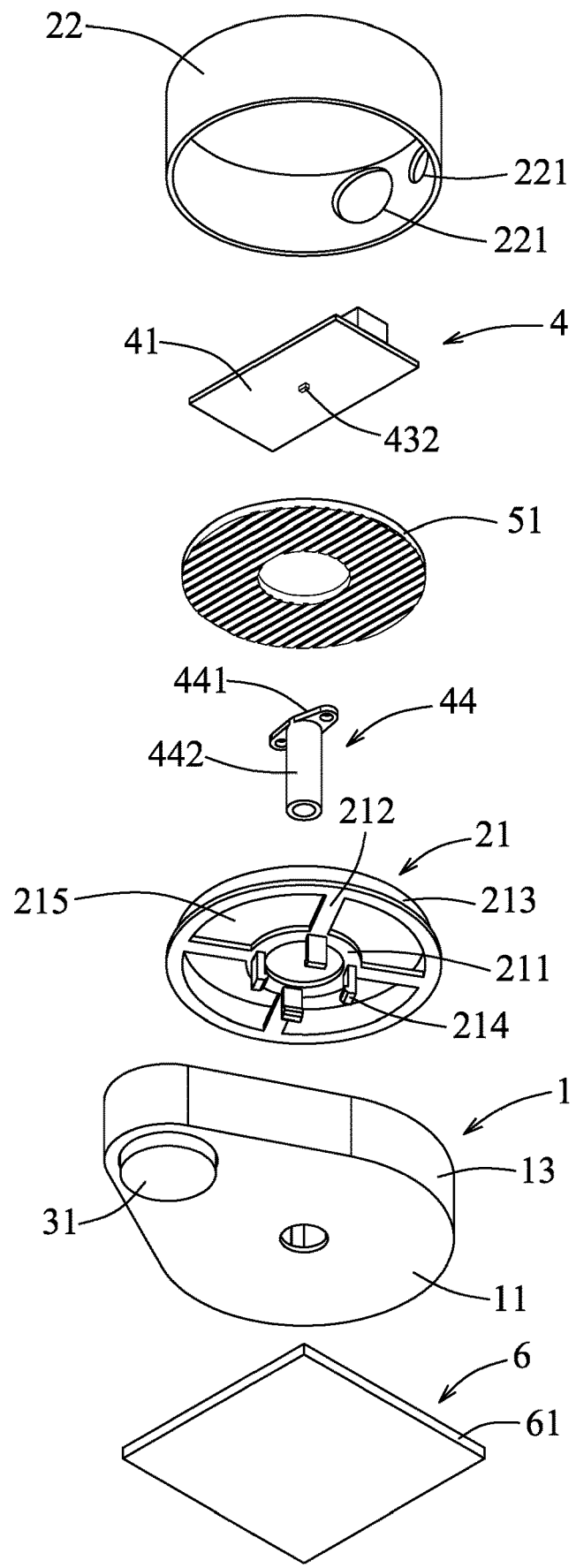
FIG. 5 is a partly exploded bottom perspective view of the first embodiment.

Referring to FIGS. 1 to 3, a first embodiment of an electronic device according to the disclosure includes a base seat 1, a rotary seat 2, a drive mechanism 3, a power consumption unit 4, a power supply unit 5, and a main processing unit 6. In this embodiment, the electronic device is exemplified to be a LiDAR system, and the power consumption unit 4 is exemplified to be an optical distance measuring unit.

Referring to FIGS. 2 to 5, the base seat 1 includes a mounting base 11 and a seat-supporting structure 12 that extends upwardly from the mounting base 11. In this embodiment, the base seat 1 further includes a peripheral wall 13 that extends upwardly from a periphery of the mounting base 11. The mounting base 11 and the peripheral wall 13 cooperatively define a receiving space 14. In this embodiment, the seat-supporting structure 12 includes an annular wall 121 extending upwardly from and integrally formed with the mounting base 11, a plurality of inner resilient hooks 122 extending upwardly from an inner peripheral surface of the annular wall 121, and a ball bearing 123. The ball bearing 123 has an inner race 123a and an outer race 123b. The inner race 123a of the ball bearing 123 has a bottom edge that abuts against a top surface of the annular wall 121, and a top edge that is hooked by the inner resilient hooks 122 so that the inner race 123a of the ball bearing 123 is securely retained by the inner resilient hooks 122.

The rotary seat 2 is rotatably coupled to the seat-supporting structure 12, and includes a support stand 21 that is spaced apart from the mounting base 11. In this embodiment, the support stand 21 has a ring portion 211, a peripheral wall portion 213 surrounding the ring portion 211, a plurality of rib portions 212 extending radially and outwardly from the ring portion 211 and interconnecting the ring portion 211 and the peripheral wall portion 213, and a plurality of outer resilient hooks 214 extending downwardly from and integrally formed with the ring portion 211. The outer race 123b of the ball bearing 123 has a top edge that abuts against the ring portion 211 of the support stand 21, and a bottom edge that is hooked by the outer resilient hooks 214 so that the outer race 123b of the ball bearing 123 is securely retained by the outer resilient hooks 214, and that the support stand 21 is securely coupled to and can rotate together with the outer race 123b of the ball bearing 123. The ring portion 211, the peripheral wall portion 213, and the rib portions 212 cooperatively define a plurality of sector-shaped spaces 215.

The drive mechanism 3 is disposed in the base seat 1, and is for driving the rotary seat 2 to rotate on the seat-supporting structure 12 of the base seat 1. In this embodiment, the drive mechanism 3 includes a motor 31, and a transmission member 32 that is connected to the motor 31 and the rotary seat 2 in such a way that the motor 31 drives rotation of the rotary seat 2. More specifically, the transmission member 32 is a belt that is trained on an outer surface of the peripheral wall portion 213 of the support stand 21. The motor 31 is powered by an external power source to drive the transmission member 32 to rotate the support stand 21. In this way, the outer race 123b of the ball bearing 123 co-rotates with the support stand 21.

The optical distance measuring unit 4 is disposed co-rotatably on the support stand 21 of the rotary seat 2. The optical distance measuring unit 4 includes a circuit board 41, an optical detection module 42, and a signal transmission module 43. The optical detection module 42 and the signal transmission module 43 are disposed on and electrically connected to the circuit board 41. The optical detection module 42 is disposed on and co-rotatable with the rotary seat 2, is operable to emit light and receive the light when reflected. Specifically, the optical detection module 42 includes an optical transmitter 421 for emitting a laser beam, and an optical receiver 422 for receiving the laser beam when reflected. The signal transmission module 43 includes a microprocessor 431 that receives a signal generated from the optical detection module 42, and an optical signal transmitter 432 (see FIGS. 2 and 5) that converts the signal, which is from the optical detection module 42 and which is processed by the microprocessor 431, into a light signal. The optical distance measuring unit 4 further includes an optical channel member 44 that is disposed within the seat-supporting structure 12 and that corresponds in position to the optical signal transmitter 432 of the signal transmission module 43 such that the light signal generated by the optical signal transmitter 432 passes through the optical channel member 44 to be received by the main processing unit 6. The main processing unit 6 can process a plurality of the light signals generated continuously throughout the course of operation of the optical distance measuring unit 4.

In this embodiment, the optical channel member 44 has a mounting portion 441 (see FIGS. 2 and 4) that is mounted to a bottom surface of the circuit board 41, and a tubular body portion 442 (see FIGS. 2 and 4) that extends downwardly from the mounting portion 441 through the seat-supporting structure 12 and that has an end portion exposed from the mounting base 11 of the base seat 1 so as to provide shielding and prevent interference from other light source (s). The main processing unit 6 includes a motherboard 61 and a light signal receiver 62. The light signal receiver 62 is disposed at a position corresponding to the optical channel member 44 for receiving the light signal (s).

Figure 6:
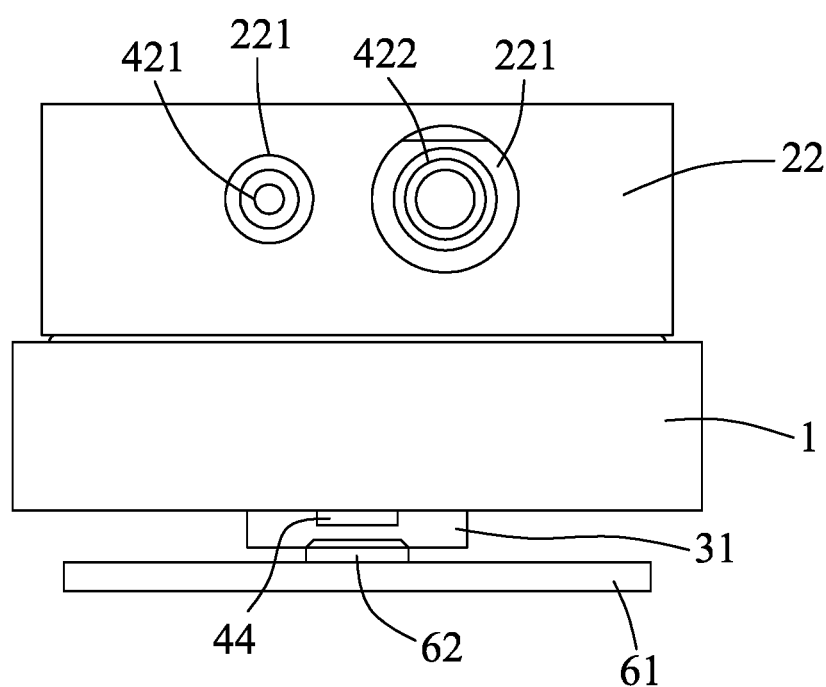
FIG. 6 is a schematic side view of the first embodiment.

In this embodiment, the rotary seat 2 further includes a cover member 22 that covers the support stand 21 and the optical distance measuring unit 4. The cover member 22 is formed with two through holes 221 that respectively correspond in position to the optical transmitter 421 and the optical receiver 422 for allowing light to pass therethrough (see FIG. 6). In addition, the base seat 1 may further include a protection cover (not shown) for covering the drive mechanism 3 and preventing the transmission member 32 from being exposed to the environment.

The power supply unit 5 includes a solar panel 51 and a light emitting module 52. The solar panel 51 is disposed on the support stand 21, and is electrically connected to the optical detection module 42 of the optical distance measuring unit 4. In this embodiment, the solar panel 51 is supported by the peripheral wall portion 213 of the support stand 21, and has a light-absorbing surface facing the sector-shaped spaces 215 of the support stand 21. The circuit board 41 of the optical distance measuring unit 4 is securely disposed on the solar panel 51. The light emitting module 52 is disposed on the mounting base 11 of the base seat 1, and is operable to emit light toward the light-absorbing surface of the solar panel 51 when the optical distance measuring unit 4 is in operation, so that the solar panel 51 transforms light energy into electric energy, which is supplied to the optical distance measuring unit 4. In this embodiment, the light emitting module 52 includes a circuit board 521 disposed on the mounting base 11, and a plurality of spaced-apart light emitting diodes 522 disposed on the circuit board 521, being operable to emit light toward the solar panel 51, and being equidistant from the solar panel 51.

The power supply unit 5 further includes a power storage module 53 that is electrically connected to the solar panel 51 and the optical distance measuring unit 4, and that is for storing the electric energy generated by the solar panel 51 and for supplying the electric energy to the optical distance measuring unit 4. The power storage module 53 may be in the form of rechargeable battery or capacitor. By virtue of the power storage module 53, power supply stability is increased. The light emitting module 52 is connected to an external power source to provide electricity to the light emitting diodes 522, so that the light emitting diodes 522 emit light toward the solar panel 51 during operation for the solar panel 51 to convert light energy into electric energy. In this way, the optical distance measuring unit 4 is continuously supplied with the electric power generated from the solar panel 51 in a wireless manner, and the rotary seat 2 can rotate at a sufficiently low speed to increase precision of the distance measurement by the optical distance measuring unit 4. Moreover, the electric power supply can be increased by increasing the light intensity of the light emitting module 52. In other embodiments, the light emitting diodes 522 may be substituted with other light emitting members.

Figure 7:
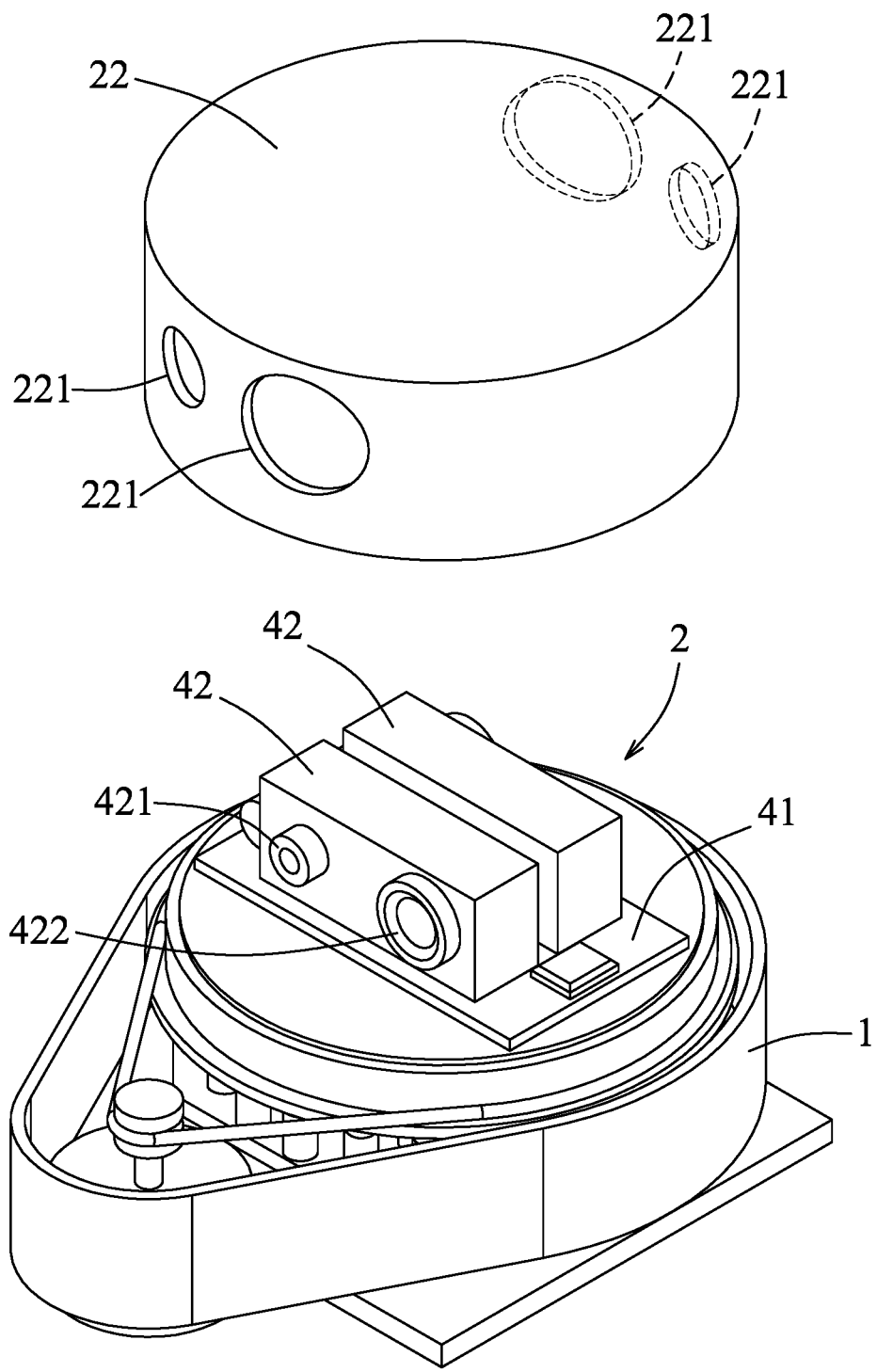
FIG. 7 is a partly exploded perspective view of a second embodiment of the electronic device according to the disclosure.
Figure 8:
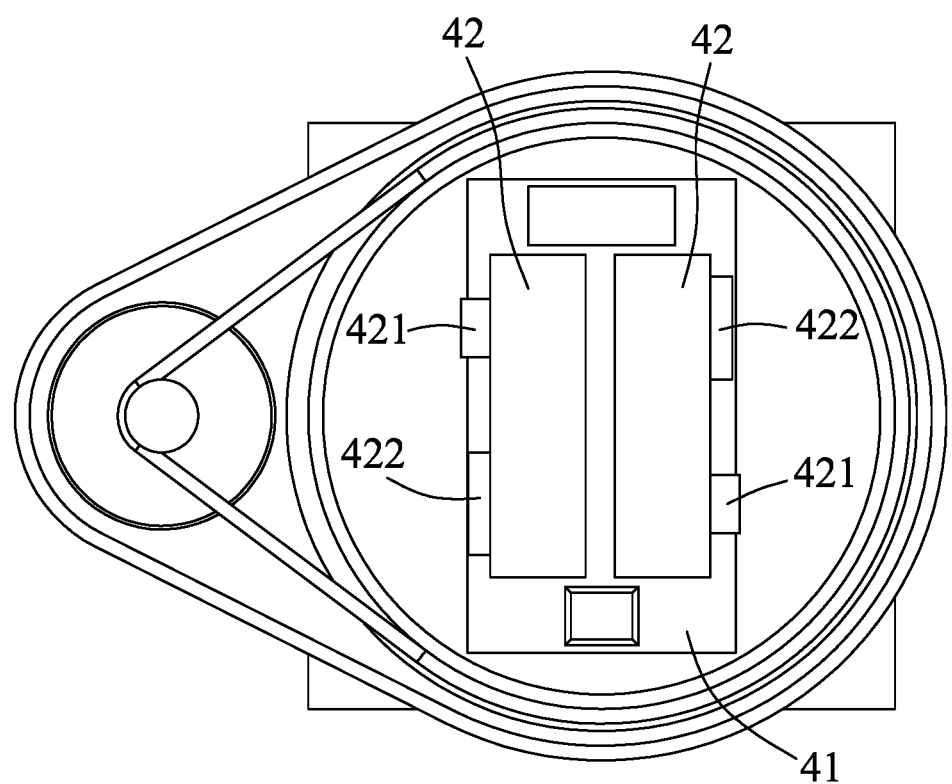
FIG. 8 is a schematic top view of the second embodiment, with a cover member of the electronic device being removed.

Referring to FIGS. 7 and 8, a second embodiment of the electronic device according to the disclosure is similar to the first embodiment. The differences between the first and second embodiments reside in that the electronic device of the second embodiment includes two of the optical detection modules 42 disposed back to back on the circuit board 41, and the cover member 22 is provided with two pairs of the through holes 221 that correspond to the optical detection modules 42, respectively. Alternatively, the two optical detection modules 42 may be stacked one above the other with the sizes of the circuit board 41, the rotary seat 2, and the base seat 1 adjusted accordingly.

Figure 9:
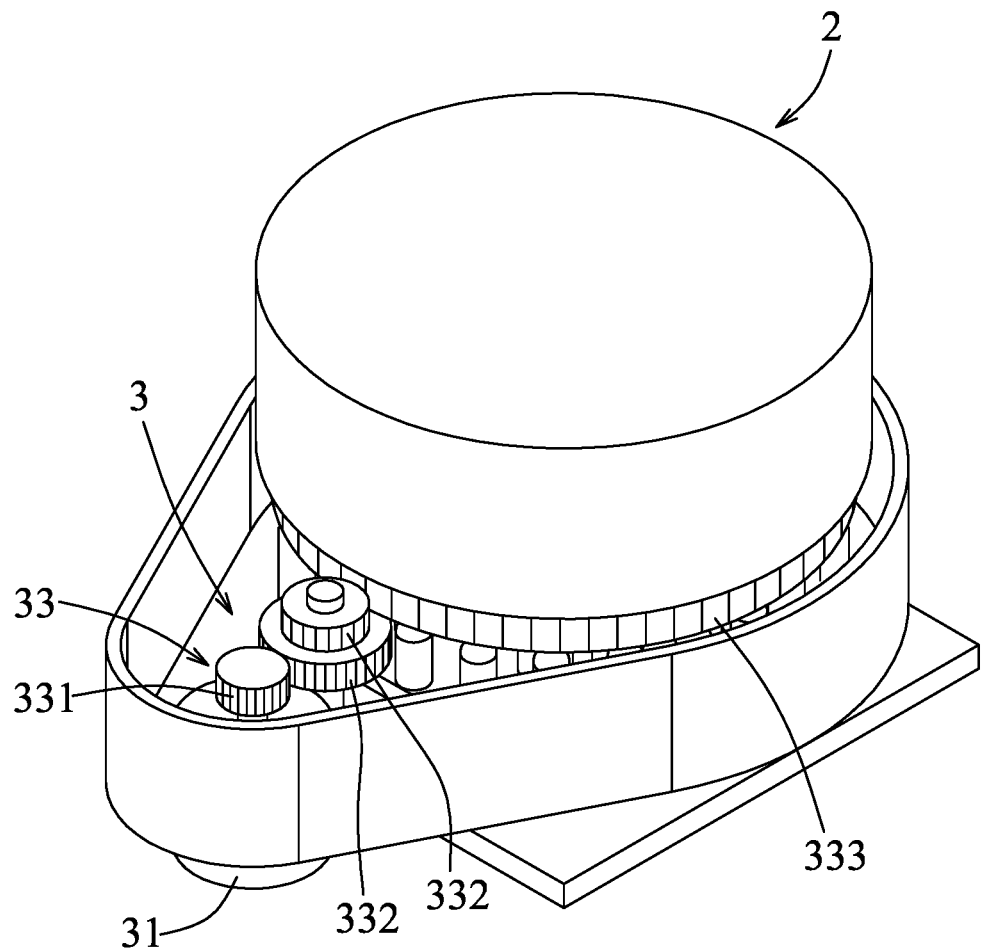
FIG. 9 is a perspective view of a third embodiment of the electronic device according to the disclosure.
Figure 10:
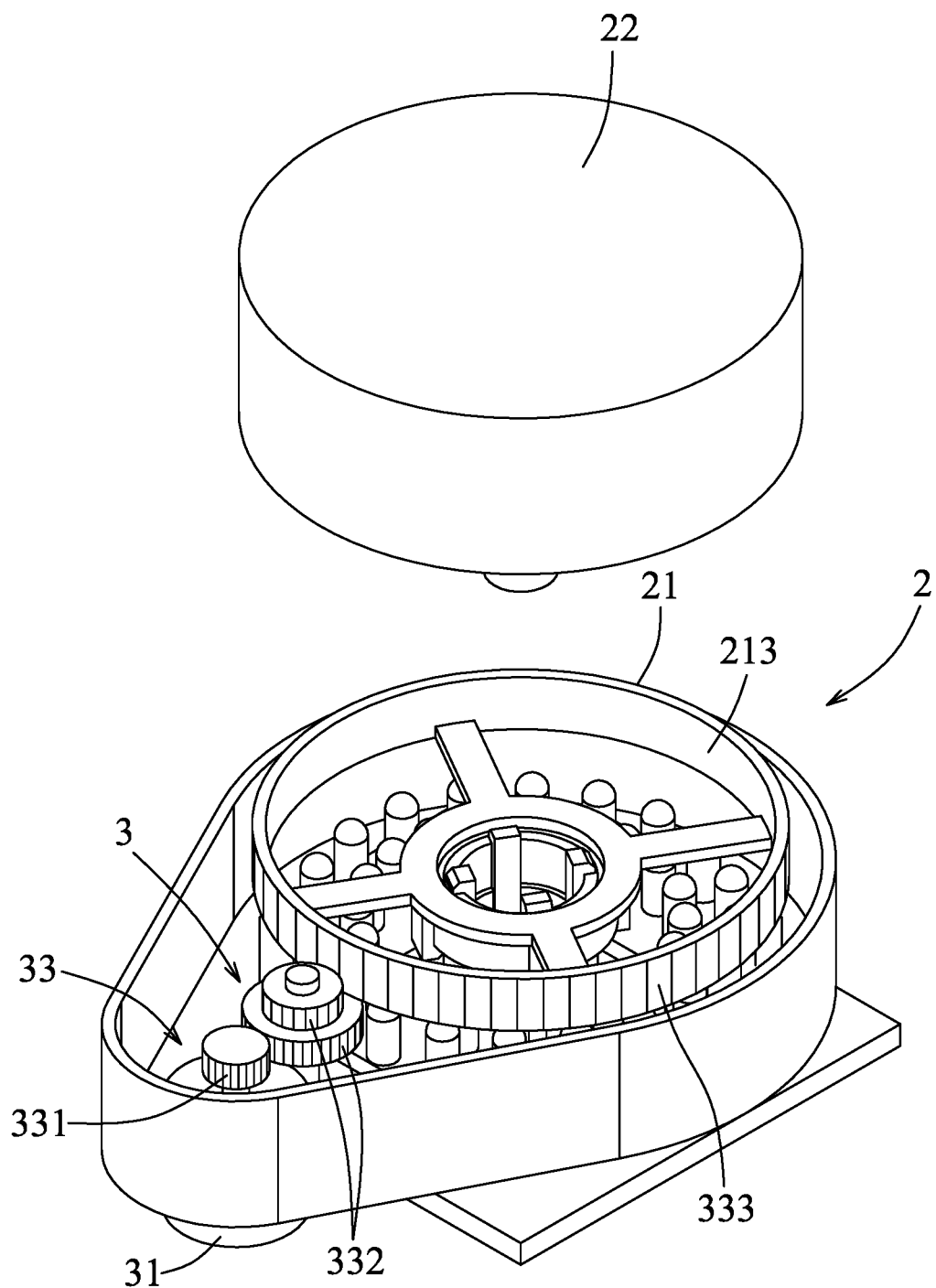
FIG. 10 is a partly exploded perspective view of the third embodiment.

Referring to FIGS. 9 and 10, a third embodiment of the electronic device according to the disclosure is similar to the first embodiment. The differences between the first and third embodiments reside in that the transmission member of the drive mechanism 3 of the third embodiment is a gear set 33 that includes a driving gear 331 connected to the motor 31, a driven gear 333 coupled to the support stand 21, and two intermediate gears 332 coaxially and co-rotatably coupled to each other and respectively meshed with the driving gear 331 and the driven gear 333. In this embodiment, the driven gear 333 is coupled to the support stand 21 by the formation of a plurality of teeth on an outer surface of the peripheral wall portion 213 of the support stand 21.

It should be noted that in the above-mentioned embodiments, the electronic device is exemplified by, but not limited to be, the LiDAR system. The optical distance measuring unit 4 can be substituted by other power consumption unit that rotates together with the rotary seat 2 during operation, that requires power supply, and that has the power supply provided by the power supply unit 5.

In summary, by virtue of the light emitting module 52 and the solar panel 51 converting light energy into electric energy, a wireless and continuous power supply is provided to the power consumption unit (i.e., the optical distance measuring unit 4), and the power supply can be increased by increasing the light intensity of the light emitting module 52. Therefore, the precision of the distance measurement by the optical distance measuring unit 4 can be ensured and does not have to be compromised.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A LiDAR system comprising:
a base seat including a mounting base and a seat-supporting structure that extends upwardly from said mounting base;
a rotary seat rotatably coupled to and surrounding said seat-supporting structure, and including a support stand;
a drive mechanism disposed in said base seat and for driving said rotary seat to rotate on and about said seat-supporting structure;
an optical distance measuring unit disposed on said support stand and co-rotatable with said rotary seat, and including at least one optical detection module that is operable to emit light and receive the light when reflected; and
a power supply unit including
a solar panel that is disposed on said support stand and that is electrically connected to said optical distance measuring unit, and
a light emitting module that is operable to emit light toward said solar panel so that said solar panel transforms light energy into electric energy, which is supplied to said optical distance measuring unit, wherein an intensity of the emitted light can be increased when said optical distance measuring unit needs more electric energy.

2. The LiDAR system as claimed in claim 1, wherein said light emitting module includes a circuit board and a plurality of light emitting diodes disposed on said circuit board.

3. The LiDAR system as claimed in claim 1, wherein said power supply unit further includes a power storage module that is electrically connected to said solar panel and said optical distance measuring unit, and that is for storing the electric energy generated by said solar panel and for supplying the electric energy to said optical distance measuring unit.

4. The LiDAR system as claimed in claim 1, wherein:
said LiDAR system further comprises a main processing unit; and
said optical distance measuring unit further includes a signal transmission module, and an optical channel member that is disposed within said seat-supporting structure and that corresponds in position to said signal transmission module such that, said signal transmission module converts a signal generated from said at least one optical detection module into a light signal which passes through said optical channel member and is received by said main processing unit.

5. The LiDAR system as claimed in claim 1, wherein said drive mechanism includes a motor and a transmission member that is connected to said motor and said rotary seat in such a way that said motor drives rotation of said rotary seat.

6. The LiDAR system as claimed in claim 1, wherein said support stand is spaced apart from said mounting base.

7. A LiDAR system comprising:
a base seat including a seat-supporting structure;
a rotary seat rotatably coupled to and surrounding said seat-supporting structure of said base seat;
a drive mechanism disposed in said base seat and for driving said rotary seat to rotate about said seat supporting structure;
at least one optical detection module disposed on and co-rotatable with said rotary seat, and being operable to emit light and receive the light when reflected; and
a power supply unit including
a solar panel that is disposed in said rotary seat and that is electrically connected to said at least one optical detection module, and
a light emitting module that is disposed in said base seat, and that is operable to emit light toward said solar panel so that said solar panel transforms light energy into electric energy, which is supplied to said at least one optical detection module, wherein an intensity of the emitted light can be increased when said at least one optical detection module needs more electric energy.

8. The LiDAR system as claimed in claim 7, wherein said light emitting module includes a circuit board and a plurality of light emitting diodes disposed on said circuit board.

9. The LiDAR system as claimed in claim 7, wherein said power supply unit further includes a power storage module that is electrically connected to said solar panel and said at least one optical detection module, and that is for storing the electric energy generated by said solar panel and for supplying the electric energy to said at least one optical detection module.

10. The LiDAR system as claimed in claim 7, further comprising a main processing unit, a signal transmission module, and an optical channel member that is disposed within said base seat and that corresponds in position to said signal transmission module such that, said signal transmission module converts a signal generated from said at least one optical detection module into a light signal which passes through said optical channel member and is received by said main processing unit.

11. The LiDAR system as claimed in claim 7, wherein said drive mechanism includes a motor and a transmission member that is connected to said motor and said rotary seat in such a way that said motor drives rotation of said rotary seat.

12. An electronic device comprising:
a base seat including a mounting base and a seat-supporting structure that extends upwardly from said mounting base;
a rotary seat rotatably coupled to and surrounding said seat-supporting structure of said base seat;
a drive mechanism disposed on said base seat and for driving said rotary seat to rotate about said seat-supporting structure;
a power consumption unit configured to measure a distance optically disposed in and co-rotatable with said rotary seat; and
a power supply unit including
a solar panel that is disposed in said rotary seat and that is electrically connected to said power consumption unit, and
a light emitting module that is disposed on said mounting base, and that is operable to emit light toward said solar panel so that said solar panel transforms light energy into electric energy, which is supplied to said power consumption unit, wherein an intensity of the emitted light can be increased when said power consumption unit needs more electric energy.

13. The electronic device as claimed in claim 12, wherein said light emitting module includes a circuit board and a plurality of light emitting diodes disposed on said circuit board.

14. The electronic device as claimed in claim 12, wherein said power supply unit further includes a power storage module that is electrically connected to said solar panel and said power consumption unit, and that is for storing the electric energy generated by said solar panel and for supplying the electric energy to said power consumption unit.

15. The electronic device as claimed in claim 12, wherein:
said electronic device further comprises a main processing unit; and
said power consumption unit includes at least one optical detection module that is disposed on and co-rotatable with said rotary seat, a signal transmission module, and an optical channel member that is disposed within said base seat and that corresponds in position to said signal transmission module such that, said signal transmission module converts a signal generated from said at least one optical detection module into a light signal which passes through said optical channel member and is received by said main processing unit.

16. The electronic device as claimed in claim 12, wherein said drive mechanism includes a motor and a transmission member that is connected to said motor and said rotary seat in such a way that said motor drives rotation of said rotary seat.

17. An electronic device comprising:
a base seat including a seat-supporting structure;
a rotary seat coupled to and surrounding said seat-supporting structure;
a drive mechanism disposed for driving said rotary seat to rotate on and about said seat-supporting structure of said base seat;
a power consumption unit configured to measure a distance optically disposed on and co-rotatable with said rotary seat; and
a power supply unit including
a solar panel that is disposed in said rotary seat and that is electrically connected to said power consumption unit, and
a light emitting module that includes a plurality of light emitting diodes disposed on said base seat and operable to emit light toward said solar panel so that said solar panel transforms light energy generated by said light emitting diodes into electric energy, which is supplied to said power consumption unit, wherein an intensity of the emitted light can be increased when said power consumption unit needs more electric energy.

18. The electronic device as claimed in claim 17, wherein said light emitting module includes a circuit board and a plurality of light emitting diodes disposed on said circuit board.

19. The electronic device as claimed in claim 17, wherein said power supply unit further includes a power storage module that is electrically connected to said solar panel and said power consumption unit, and that is for storing the electric energy generated by said solar panel and for supplying the electric energy to said power consumption unit.

20. The electronic device as claimed in claim 17, wherein:
said electronic device further comprises a main processing unit; and
said power consumption unit includes at least one optical detection module that is disposed on and co-rotatable with said rotary seat, a signal transmission module, and an optical channel member that is disposed within said base seat and that corresponds in position to said signal transmission module such that, said signal transmission module converts a signal generated from said at least one optical detection module into a light signal which passes through said optical channel member and is received by said main processing unit.

* * * * *